(12) United States Patent
Erle et al.

(10) Patent No.: US 7,721,171 B2
(45) Date of Patent: May 18, 2010

(54) SCHEME TO OPTIMIZE SCAN CHAIN ORDERING IN DESIGNS

(75) Inventors: Mark A. Erle, Macungie, PA (US); Bruce M. Fleischer, Bedford Hills, NY (US); Daniel Lipetz, Flushing, NY (US)

(73) Assignee: International Business Machines Corporation, Armonk, NY (US)

( * ) Notice: Subject to any disclaimer, the term of this patent is extended or adjusted under 35 U.S.C. 154(b) by 320 days.

(21) Appl. No.: 11/839,648

(22) Filed: Aug. 16, 2007

(65) Prior Publication Data

US 2009/0049353 A1   Feb. 19, 2009

(51) Int. Cl.
*G01R 31/28* (2006.01)

(52) U.S. Cl. .................. 714/729; 714/726; 714/727; 716/1; 716/2; 716/4; 716/5; 716/6; 716/7; 716/8; 716/10; 716/11; 716/12; 716/14

(58) Field of Classification Search .................. None
See application file for complete search history.

(56) References Cited

U.S. PATENT DOCUMENTS

| | | | |
|---|---|---|---|
| 5,208,764 A * | 5/1993 | Rusu et al. ..................... 716/8 |
| 6,189,128 B1 * | 2/2001 | Asaka ........................... 716/4 |
| 6,405,355 B1 * | 6/2002 | Duggirala et al. .............. 716/8 |
| 6,681,356 B1 * | 1/2004 | Gerowitz et al. ............ 714/729 |
| 7,055,118 B1 * | 5/2006 | Kamepalli et al. ............. 716/5 |
| 2003/0188282 A1 * | 10/2003 | Yang et al. ..................... 716/10 |
| 2006/0026472 A1 * | 2/2006 | Adkisson et al. ............ 714/726 |
| 2008/0127021 A1 * | 5/2008 | Goel et al. ..................... 716/10 |
| 2009/0077437 A1 * | 3/2009 | Conlin ........................ 714/726 |

* cited by examiner

*Primary Examiner*—John P Trimmings
(74) *Attorney, Agent, or Firm*—Cantor Colburn LLP; William A. Kinnaman, Jr.

(57) ABSTRACT

A method for optimizing a scan chain ordering in circuit designs in an electronic computer-aided design system is provided. The method comprising: creating a schematic representative of a circuit design having a first cell and a second cell, the first cell and the second cell each having latches therein; creating a scan input pin and a scan output pin for each of the latches in the first cell and the second cell on the schematic; generating a first label on the schematic to provide a first wiring arrangement for the latches in the circuit design, the first wiring arrangement identifies a first order to which the scan input of each of the latches is wired to the scan output of another one of the latches; creating a layout representative of the circuit design; generating a first scan chain having a first length on the layout based on the first wiring arrangement; creating a second scan chain from the first scan chain on the layout, the second scan chain having a second length less than the first length of the first scan chain; and generating a second label on the schematic based on the second scan chain, the second label provides a second wiring arrangement for the latches in the circuit design, the second wiring arrangement identifies a second order to which the scan input of each of the latches is wired to the scan output of another one of the latches.

9 Claims, 6 Drawing Sheets

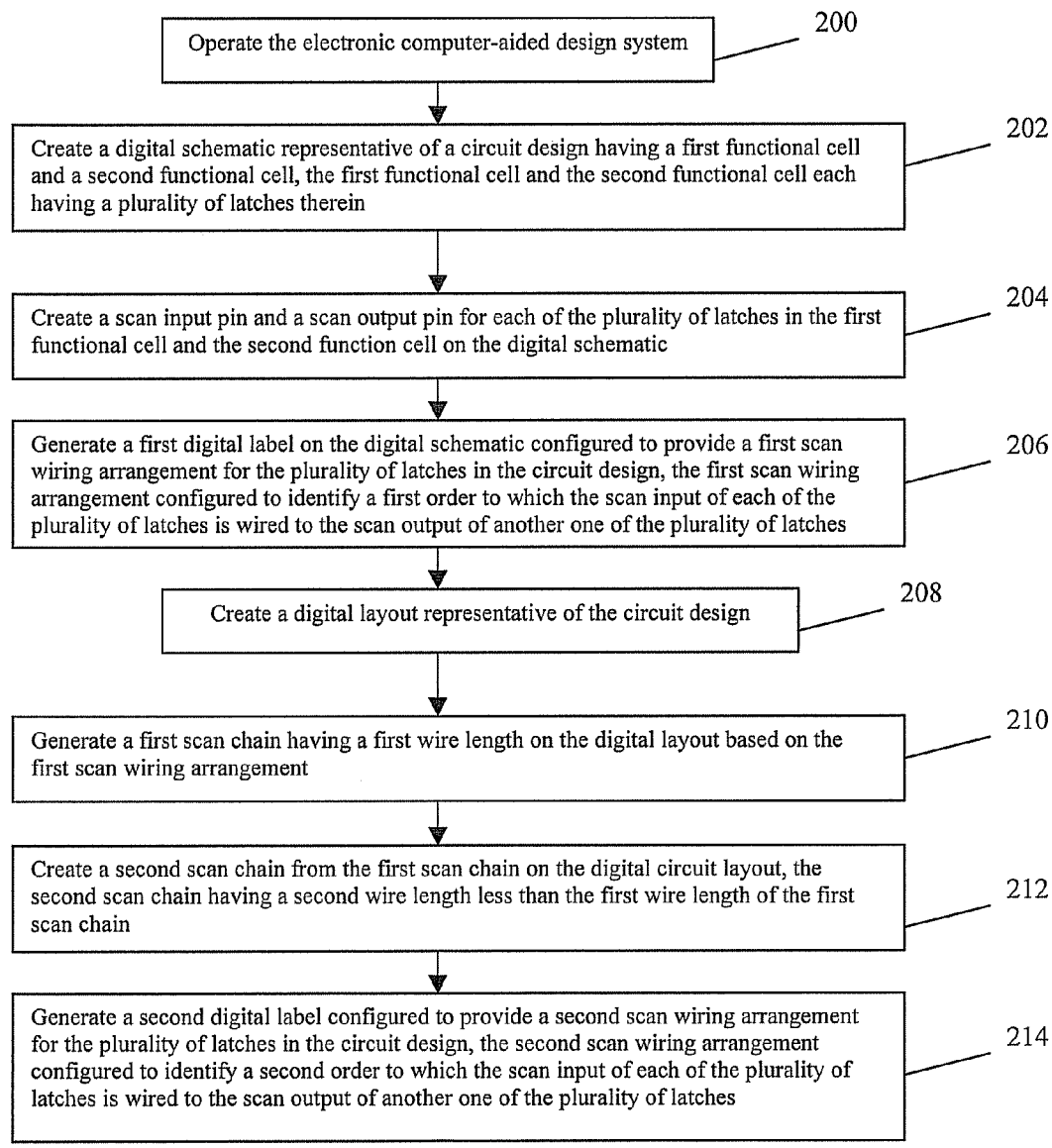

SCHEME TO OPTIMIZE SCAN CHAIN ORDERING IN DESIGNS

TRADEMARKS

IBM® is a registered trademark of International Business Machines Corporation, Armonk, N.Y., U.S.A. Other names used herein may be registered trademarks, trademarks or product names of International Business Machines Corporation or other companies.

BACKGROUND OF THE INVENTION

1. Field of the Invention

This invention relates to an electronic computer-aided system, and particularly to a method of optimizing a scan chain ordering in circuit designs involving latches therein.

2. Description of Background

When designers design custom macros or circuit designs involving latches or flip-flops they must also implement a scan chain. A scan chain is a technique used to test various circuit designs involving latches, where each latch is wired together to form the scan chain in which each latch is tested and observed by the designer using design automation software where the designer can graphically build the circuit design through a schematic and layout representation.

When designing integrated circuits involving latches, levels and sublevels of hierarchy are formed, where each level and sublevel include a number of latches grouped in one or more cells in the hierarchy. Each cell is designed to include a cell scan input pin and a cell scan output pin, where every cell scan input pin of one cell is wired to a cell scan output pin of another cell, thereby forming a scan chain. Of the cells in the scan chain, one cell scan input pin of a cell in the scan chain is wired to a primary circuit scan input pin and one cell scan output pin of another cell in the scan chain is wired to a primary circuit scan output pin. Within each cell, the latch scan input pin of each latch is wired to a latch scan output pin of another latch within the cell. The primary circuit scan input pin is where the scan chain begins and the primary circuit scan output pin is where the scan chain ends. In general terms, during scan testing, designers send a predetermined pattern through the cells in the order of the scan chain at the primary circuit scan output pin and out the primary circuit scan output pin where the designer can obtain the status of the latches in the scan chain. As such, the designer can determine the state of each latch within the integrated circuit.

During the schematic build process, the designer usually follows the convention of a hardware description language, such as Verilog or VHDL to hook up the scan chain. This is usually done for correspondence purposes for logic checking. However, the scan chain is usually not an optimal hook-up because it is not placement driven. Once the placement is made in the layout process, the designer must go back to the schematic and make the scan chain location driven to minimize wires and resources. However, this usually involves messy pin additions, wire namings, and a messy style. Updating the schematic to reflect the location driven scan chain may also be timely.

SUMMARY OF THE INVENTION

The shortcomings of the prior art are overcome and additional advantages are provided through the provision of a method for optimizing a scan chain ordering in circuit designs in an electronic computer-aided design system, the method comprising: creating a digital schematic representative of a circuit design having a first functional cell and a second functional cell, the first functional cell and the second functional cell each having a plurality of latches therein; creating a scan input pin and a scan output pin for each of the plurality of latches in the first functional cell and the second functional cell on the digital schematic; generating a first digital label on the digital schematic, the first digital label configured to provide a first scan wiring arrangement for the plurality of latches in the circuit design, the first scan wiring arrangement configured to identify a first order to which the scan input of each of the plurality of latches is wired to the scan output of another one of the plurality of latches; creating a digital layout representative of the circuit design; generating a first scan chain having a first wire length on the digital circuit layout based on the first scan wiring arrangement; creating a second scan chain from the first scan chain on the digital circuit layout, the second scan chain having a second wire length less than the first wire length of the first scan chain; and generating a second digital label on the digital schematic based on the second scan chain, the second digital label provides a second scan wiring arrangement for the plurality of latches in the circuit design, the second scan wiring arrangement configured to identify a second order to which the scan input of each of the plurality of latches is wired to the scan output of another one of the plurality of latches.

The shortcomings of the prior art are overcome and additional advantages are provided through the provision of an electronic computer-aided design system for optimizing a scan chain ordering in circuit designs, the system comprising: a computer readable medium having a computer program configured to create a digital schematic representative of a circuit design having a first functional cell and a second functional cell, the first functional cell and the second functional cell each having a plurality of latches therein; create a scan input pin and a scan output pin for each of the plurality of latches in the first functional cell and the second functional cell on the digital schematic; generate a first digital label on the digital schematic, the first digital label configured to provide a first scan wiring arrangement for the plurality of latches in the circuit design, the first scan wiring arrangement configured to identify a first order to which the scan input of each of the plurality of latches is wired to the scan output of another one of the plurality of latches; create a digital layout representative of the circuit design; generate a first scan chain having a first wire length on the digital layout based on the first scan wiring arrangement; create a second scan chain from the first scan chain on the digital layout, the second scan chain having a second wire length less than the first wire length of the first scan chain; and generate a second digital label on the digital schematic based on the second scan chain, the second digital label provides a second scan wiring arrangement for the plurality of latches in the circuit design, the second scan wiring arrangement configured to identify a second order to which the scan input of each of the plurality of latches is wired to the scan output of another one of the plurality of latches.

System and computer program products corresponding to the above-summarized methods are also described and claimed herein.

Additional features and advantages are realized through the techniques of the present invention. Other embodiments and aspects of the invention are described in detail herein and are considered a part of the claimed invention. For a better understanding of the invention with advantages and features, refer to the description and to the drawings.

TECHNICAL EFFECTS

As a result of the summarized invention, technically we have achieved a solution for optimizing scan chain ordering in circuit designs based on physical placement by dedicating a scan input pin and a scan output pin for each latch involved in the circuit design.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

FIG. 6 illustrates an exemplary VHDL code in accordance with one exemplary embodiment of the present invention; and FIG. 7 illustrates a flow-chart diagram that provides a method for optimizing scan chain ordering in circuit designs in accordance with one exemplary embodiment of the present invention.

Figure 1:
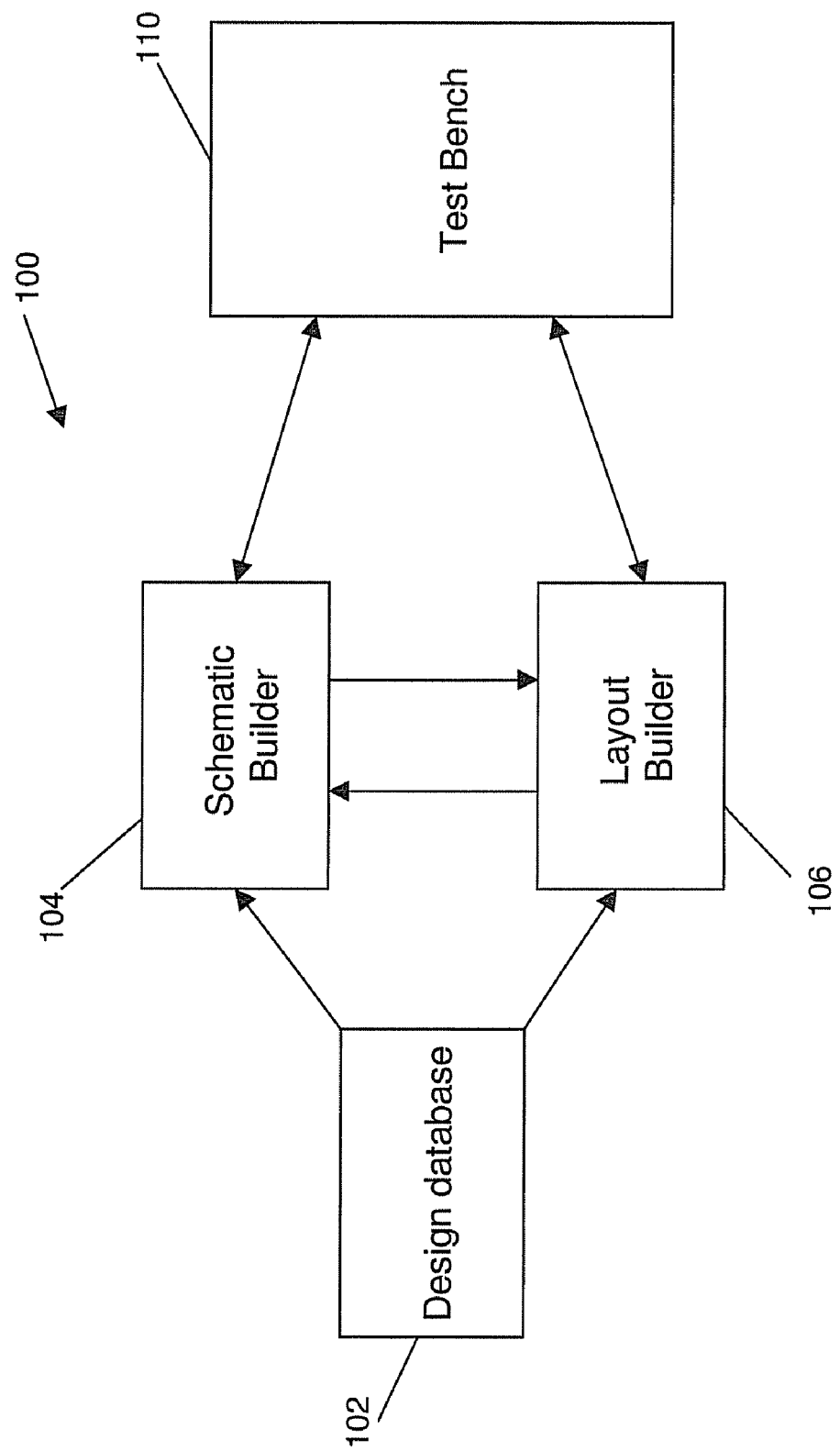
FIG. 1 illustrates an electronic computer-aided design system in accordance with one exemplary embodiment of the present invention.

The detailed description explains the preferred embodiments of the invention, together with advantages and features, by way of example with reference to the drawings.

DETAILED DESCRIPTION OF THE INVENTION

Exemplary embodiments of an electronic computer-aided design (ECAD) system and a method of using the same in accordance with the present invention will now be described with reference to the drawings. The exemplary embodiment of an ECAD system described herein is configured to create a digital schematic and a digital layout representative of a circuit design having a plurality of functional cells that each includes a plurality of latches therein. The exemplary embodiment of an ECAD system described herein is further configured to create a scan input pin and a scan output pin for each of a plurality of latches in each of a plurality of functional cells on a digital schematic. The exemplary embodiment of an ECAD system described herein is further configured to generate a first digital label on a digital schematic, where the first digital label is configured to provide a first scan wiring arrangement for a plurality of latches in a circuit design. The exemplary embodiment of an ECAD system described herein is further configured to generate a first scan chain having a first wire length on a digital layout based on a first scan wiring arrangement. The exemplary embodiment of an ECAD system described herein is further configured to create a second scan chain from a first scan chain on a digital layout, where the second scan chain has a second wire length less than a first wire length of the first scan chain. The exemplary embodiment of an ECAD system described herein is further configured to generate a second digital label on the digital schematic based on the second scan chain, where the second digital label is configured to provide a second scan wiring arrangement for the plurality of latches in a circuit design, where the second scan wiring arrangement is configured to identify a second order to which the scan input of each of a plurality of latches is wired to the scan output of another one of the plurality of latches.

The inventors herein have recognized that having a process of dedicating a scan input pin and a scan output pin for each latch involved in a circuit design will optimize scan chain ordering in circuit designs and minimize wires. The inventors herein have further recognized that having a process of dedicating a scan input pin and a scan output pin for each latched involved in a circuit design will make for a seamless process of creating a digital schematic and a digital layout representative of the circuit design and updating the same without involving messy pin additions, wire namings, a messy style, and will minimize fabrication time.

As used herein, the "top level" of the circuit design is the highest level of the hierarchy or the main level of the circuit design, in which all the sub-levels fall beneath from. As used herein, the "sub-level" of the circuit design is any level below the top level, not necessarily the level directly beneath the top level.

Generally speaking, and in accordance with one embodiment of this invention, an electronic computer-aided design system is provided that employs a process of optimizing scan chain ordering in design circuits. In one embodiment, the process employed generally includes creating a digital schematic representative of a circuit design having a first functional cell and a second functional cell where each cell includes a plurality of latches therein. In one embodiment, the process further includes creating a scan input pin and a scan output pin for each of the plurality of latches in the first functional cell and the second function cell on the digital schematic. In one embodiment, the process further includes generating a first digital label on the digital schematic configured to provide a first scan wiring arrangement for the plurality of latches in the circuit design, the first scan wiring arrangement configured to identify a first order to which the scan input of each of the plurality of latches is wired to the scan output of another one of the plurality of latches. In one embodiment, the process further includes creating a digital circuit layout representative of the circuit design. In one embodiment, the process further includes generating a first scan chain having a first wire length on the digital layout based on the first scan wiring arrangement. In one embodiment, the process further includes creating a second scan chain from the first scan chain on the digital layout, the second scan chain having a second wire length less than the first wire length of the first scan chain. In one embodiment, the process further includes generating a second digital label based on the second scan chain on the digital schematic, where the second digital label is configured to provide a second scan wiring arrangement for the plurality of latches in the circuit design, the second scan wiring arrangement configured to identify a second order to which the scan input of each of the plurality of latches is wired to the scan output of another one of the plurality of latches.

FIG. 1 is a data-flow diagram of an electronic-computer-aided design (ECAD) system 100 for automated design verification according to the present invention. The system 100 includes a design database 102, a schematic builder 104, a layout builder 106, and a test bench 110. In one exemplary embodiment, the test bench 100 is a computer system configured for a user (e.g., designer) to operate, access design database 102, and create a digital schematic and a digital layout representative of a circuit design through schematic builder 104 and layout builder 106 respectively.

In accordance with one embodiment, design database 102 includes several tools for designing an integrated circuit. Generally speaking, design database 102 is a conventional design database for use in automated design. In one embodiment, design database 102 includes various parts/components (e.g., latches) for graphically building a circuit design and automating the same. In other words, design database 102 includes a set of conventional building blocks for graphically representing a circuit design through a digital schematic and a digital layout.

In accordance with one embodiment, the schematic builder 104 is configured to create a digital schematic representative of a circuit design. The digital schematic for representing a circuit design is created by a designer to show various aspects of the circuit design using abstract, graphic symbols (e.g., a box). In one embodiment, the circuit design includes levels of hierarchy with latches in one or more functional cells in the hierarchy. Each level of the hierarchy may include functional cells with functional sub-cells and those functional sub-cells may include functional sub-cells and so on, thereby creating various levels for representing the circuit design. For simplistic purposes, exemplary embodiments of a circuit design in accordance with the present invention will be described in greater detail as having a top level and a sub-level having latches therein. However, it should be understood that various levels of hierarchy can be made in the circuit design in accordance with exemplary embodiments of the present invention and should not be limited to the example set forth above.

Figure 2:
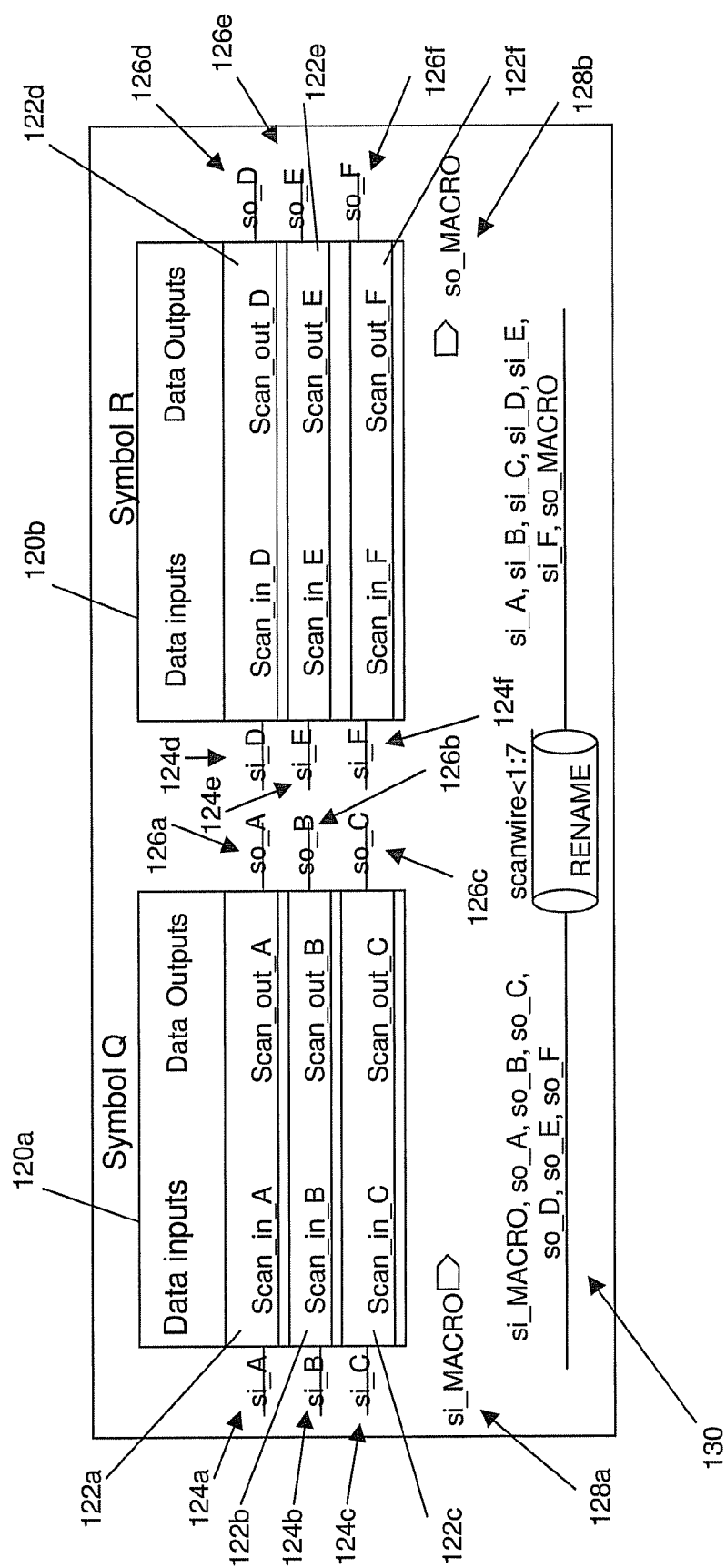
FIG. 2 illustrates an exemplary digital schematic having a first digital label in accordance with one exemplary embodiment of the present invention.

FIG. 2 illustrates a digital schematic being representative of a circuit design in accordance with one embodiment. In one embodiment, the circuit design is being represented through the digital schematic to include a plurality of functional cells 120*a*, 120*b*. In one embodiment, functional cells 120*a*, 120*b* represent a sub-level of the circuit design and are configured to provide a particular function (e.g., computing function) in the circuit design in accordance with one embodiment. In one embodiment, each of the functional cells 120*a*, 120*b* include a plurality of latches therein, which may be a sub-level of the sub-level of the functional cells 120*a*, 120*b* in accordance with one embodiment. In one embodiment, functional cell 120*a* includes a plurality of latches 122*a*, 122*b*, 122*c* while functional cell 120*b* includes a plurality of latches 122*d*, 122*e*, 122*f* in accordance with one embodiment. Of course, each of the functional cells 120*a*, 120*b* may include more or less latches then is shown in FIG. 2. In one embodiment, the latches 122*a*, 122*b*, 122*c*, 122*d*, 122*e*, 122*f* each comprise of a conventional latch or flip-flop.

In accordance with one embodiment, each of the plurality of latches 122*a*, 122*b*, 122*c*, 122*d*, 122*e*, 122*f* respectively includes a dedicated scan input pin 124*a*, 124*b*, 124*c*, 124*d*, 124*e*, 124*f* and respectively includes a scan output pin 126*a*, 126*b*, 126*c*, 126*d*, 126*e*, 126*f*.

In one embodiment, the circuit design is being represented through the digital schematic to include a primary scan input pin 128*a* and a primary scan output pin 128*b*, which represent a top level of the circuit design in accordance with one embodiment. In one embodiment, the sub-level of the circuit design is wired to the top level of the circuit design, which will further be discussed below. The primary scan input pin 128*a* is configured to receive a predetermined pattern to be pass through the circuit design, and consequently through the latches therein, for testing purposes in accordance with one embodiment. The primary scan output pin 128*b* is configured to provide the designer a read out of the state of each latch involved in the circuit design. In other words, latches involved in the circuit design can be tested by passing a predetermined pattern through the primary scan input pin 128*a* of the circuit design and receiving a read-out of the state of the latches at primary scan output pin 128*b*.

In accordance with one embodiment, the schematic builder 104 is configured to create a digital label 130 on the digital schematic as shown. The digital label 130 is configured to provide a scan wiring arrangement for the plurality of latches 122*a*, 122*b*, 122*c*, 122*d*, 122*e*, 122*f* involved in the circuit design. In one embodiment, the scan wiring arrangement identifies an order to which the scan input pin of each latch is to be wired to the scan output pin of another latch. The order provided by the scan wiring arrangement further identifies which scan input pin of one of the latches is to be wired to the primary scan input pin 128*a* of the circuit design and which scan output pin of one of the latches is to be wired to the primary scan output pin 128*b* of the circuit design. In one embodiment, the digital label 130 as shown in FIG. 2 is to be read as follows: primary scan input pin 128*a* of the circuit wires to scan input pin 124*a* of latch 122*a*; scan output pin 126*a* of latch 122*a* wires to scan input pin 124*b* of latch 122*b*; scan output pin 126*b* of latch 122*b* wires to scan input pin 124*c* of latch 122*c*; scan output pin 126*c* of latch 122*c* wires to scan input pin 124*d* of latch 122*d*; scan output pin 126*d* of latch 122*d* wires to scan input pin 124*e* of latch 122*e*; scan output pin 126*e* of latch 122*e* wires to scan input pin 124*f* of latch 122*f*; scan output pin 126*f* of latch 122*f* wires to primary scan output pin 128*b* of the circuit.

In accordance with one embodiment, the layout builder 106 is configured to create a digital layout corresponding to the digital schematic. In one embodiment, the digital layout is representative of the circuit design. The digital layout for representing the circuit design is created to resemble the layout of the functional cells and latches involved in the circuit design in a physical circuit. In one embodiment, the designer places the functional cells and latches in the digital layout according to an optimal placement scheme. For example, the functional cells and latches are placed in the digital layout based many design placement considerations, such as the size of the functional cells. Of course, other design considerations are contemplated in placing the functional cells and latches of the circuit design in the digital layout, which are dependent on the designer and various design factors.

Figure 3:
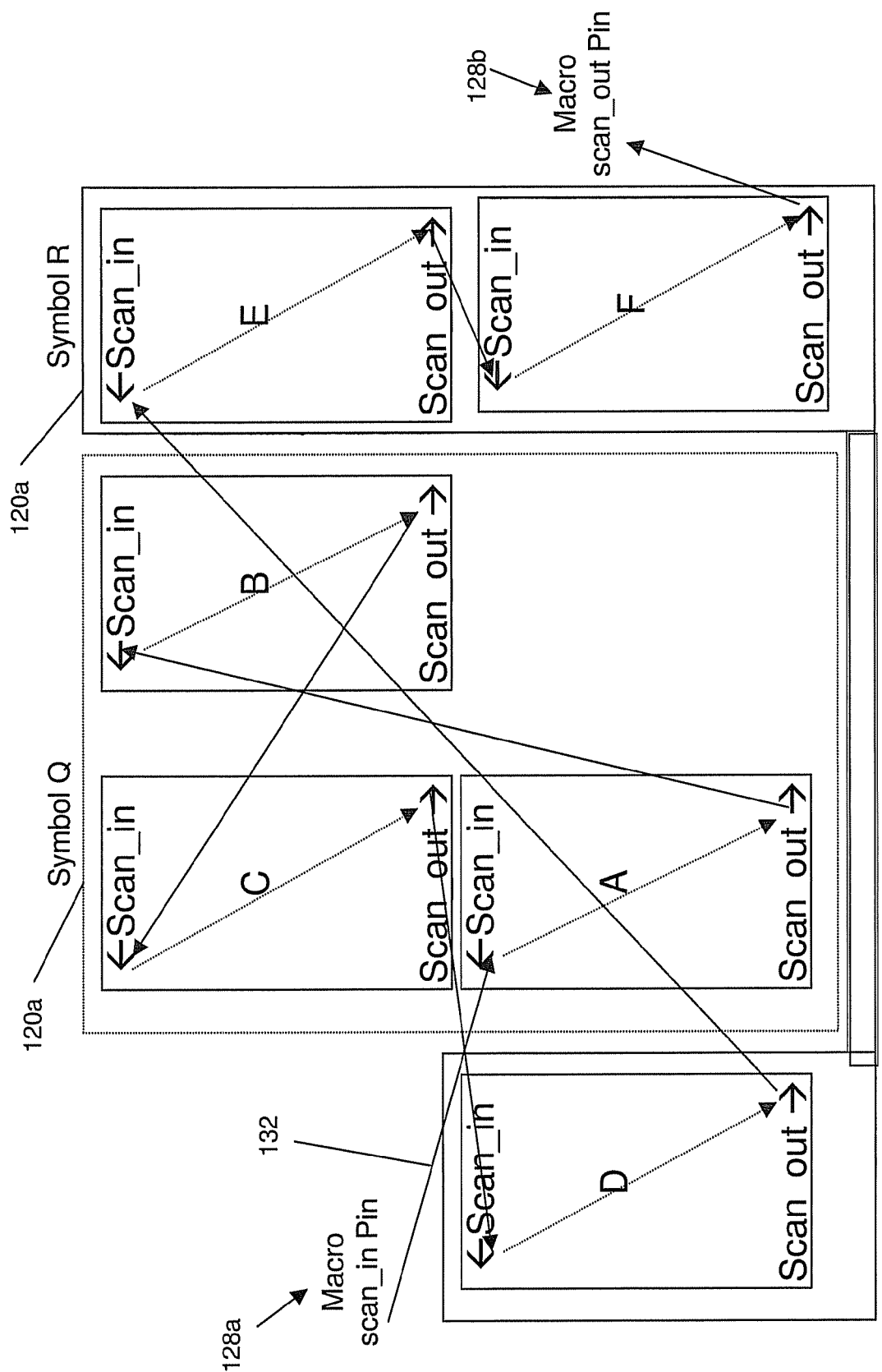
FIG. 3 illustrates an exemplary digital layout without the care of having an optimal scan chain in accordance with one exemplary embodiment of the present invention.

FIG. 3 illustrates a digital layout corresponding to the digital schematic and representative of the circuit design in accordance with one embodiment. In one embodiment, the layout builder 106 is configured to wire the latches 122*a*, 122*b*, 122*c*, 122*d*, 122*e*, 122*f*, the primary scan input pin 128*a* and primary scan output pin 128*b* within the circuit design represented by the digital layout according to the digital label 130 on the digital schematic, thus forming a scan chain, which is indicated by connected arrows 132 in FIG. 3. In one embodiment, the scan chain 132 in FIG. 3 includes a wire length in accordance with one embodiment. The wire length can be of any length depending on the number of latches within the circuit design, application or otherwise.

Figure 4:
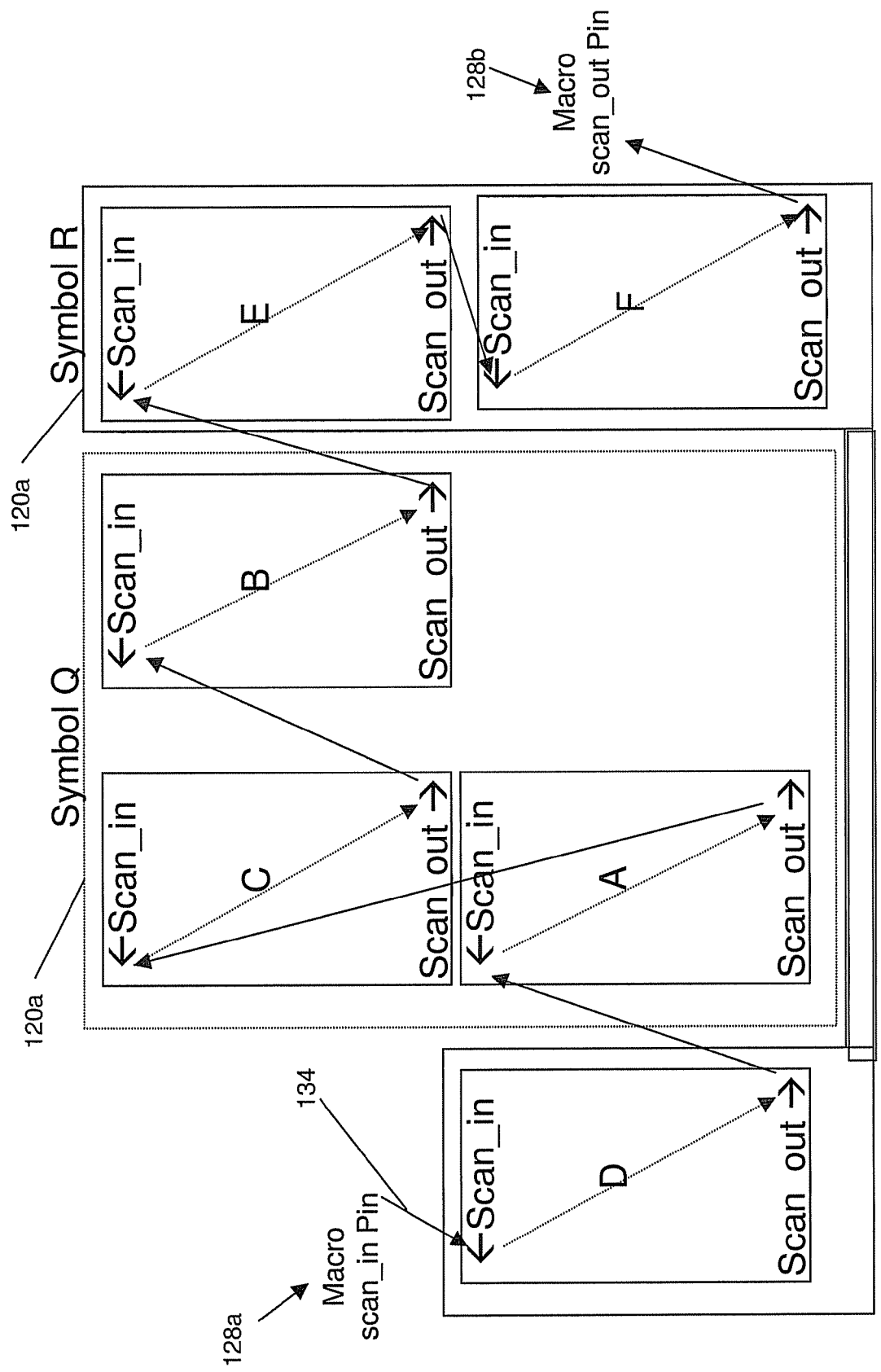
FIG. 4 illustrates an exemplary digital layout having an optimal scan chain in accordance with one exemplary embodiment of the present invention.
Figure 5:
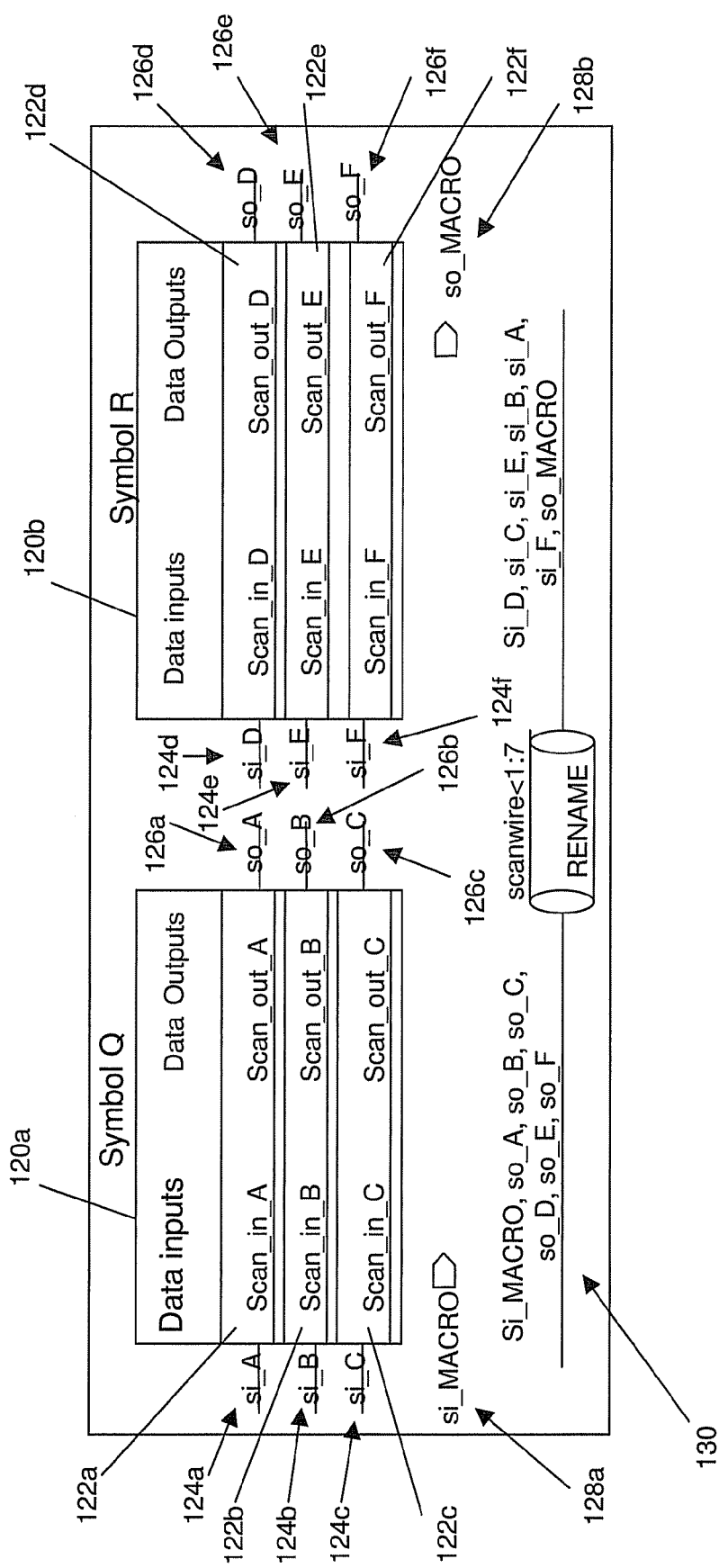
FIG. 5 illustrates an exemplary digital schematic having a second digital label in accordance with one exemplary embodiment of the present invention.

In one embodiment, the designer through the layout builder 106 modifies the hook-up of the scan chain 132 in FIG. 3 based on the placement of each of the plurality of latches 122*a*, 122*b*, 122*c*, 122*d*, 122*e*, 122*f* shown in the digital layout, thus optimizing the scan chain 132 in FIG. 3. Consequently, an optimal scan chain is formed, which is indicated by connected arrows 134 in FIG. 4. In one embodiment, the optimal scan chain 134 is determined based on the physical placement of each of the functional cells and the latches therein using an algorithm, such as Dijkstra's, in accordance with one non-limiting embodiment. In one embodiment, the optimal scan chain 134 includes a wire length in accordance with one embodiment. The wire length of the optimal scan chain 134 can be of any length depending on the number of latches within the circuit design, application or otherwise. In one embodiment, the wire length of scan chain 134 is less than the wire length of scan chain 132. Once the scan chain 132 in FIG. 3 is modified to the optimal scan chain 134 in FIG. 4, the digital label 130 on the digital schematic in FIG. 2 is updated to reflect the wiring arrangement for the plurality of latches based on optimal scan chain 134.

In accordance with one embodiment, the system 100 is configured to generate a digital representation of the digital label 130 in a hardware description language, such as VHDL. In one embodiment, the digital representation of the digital label 130 corresponds to the scan wiring arrangement or the scan path of the latches involved in the circuit design. In one embodiment, the digital representation of the digital label 130 in the VHDL is representative of the wiring scheme of the circuit design. As such, once the scan chain 132 in FIG. 3 is modified to optimal scan chain 134, the scan path order is feed back into VHDL and the digital schematic, where the VHDL and the digital schematic are updated accordingly as described above. FIG. 6 illustrates an exemplary VHDL code generated once the scan path order is determined in accordance with one embodiment.

In accordance with an exemplary embodiment of the present invention, an exemplary method for optimizing a scan chain ordering in circuit design is provided and illustrated in FIG. 7. In this exemplary method, a designer operates the electronic computer-aided design system at block 200. Then, the designer creates a digital schematic representative of a circuit design having a first functional cell and a second functional cell, the first functional cell and the second functional cell each having a plurality of latches therein at block 202. Next, the designer creates a scan input pin and a scan output pin for each of the plurality of latches in the first functional cell and the second function cell on the digital schematic at block 204. As such, the pins of the latches are accessible at the top level of the circuit design. At block 206, generate a first digital label on the digital schematic configured to provide a first scan wiring arrangement for the plurality of latches in the circuit design, the first scan wiring arrangement configured to identify a first order to which the scan input of each of the plurality of latches is wired to the scan output of another one of the plurality of latches. Create a digital layout representative of the circuit design at block 208. At block 210, generate a first scan chain having a first wire length on the digital layout based on the first scan wiring arrangement. Then, create a second scan chain from the first scan chain on the digital circuit layout, the second scan chain having a second wire length less than the first wire length of the first scan chain at block 212. Next, generate a second digital label configured to provide a second scan wiring arrangement for the plurality of latches in the circuit design, the second scan wiring arrangement configured to identify a second order to which the scan input of each of the plurality of latches is wired to the scan output of another one of the plurality of latches at block 214.

In accordance with one embodiment, the scan chain is completed by wiring the primary input pin 128a and the primary output pin 128b located on the top level of the circuit design to one of the scan input pins of one of the plurality of latches and one of the scan output pins of another of the plurality of latches respectively.

The capabilities of the present invention can be implemented in software, firmware, hardware or some combination thereof.

As one example, one or more aspects of the present invention can be included in an article of manufacture (e.g., one or more computer program products) having, for instance, computer usable media. The media has embodied therein, for instance, computer readable program code means for providing and facilitating the capabilities of the present invention. The article of manufacture can be included as a part of a computer system or sold separately.

Additionally, at least one program storage device readable by a machine, tangibly embodying at least one program of instructions executable by the machine to perform the capabilities of the present invention can be provided.

The flow diagrams depicted herein are just examples. There may be many variations to these diagrams or the steps (or operations) described therein without departing from the spirit of the invention. For instance, the steps may be performed in a differing order, or steps may be added, deleted or modified. All of these variations are considered a part of the claimed invention.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A method for optimizing a scan chain ordering in circuit designs in an electronic computer-aided design system, the method comprising:

creating a digital schematic representative of a circuit design having a first functional cell and a second functional cell, the first functional cell and the second functional cell each having a plurality of latches therein;

creating a scan input pin and a scan output pin for each of the plurality of latches in the first functional cell and the second functional cell on the digital schematic;

generating a first digital label on the digital schematic, the first digital label configured to provide a first scan wiring arrangement for the plurality of latches in the circuit design, the first scan wiring arrangement configured to identify a first order to which the scan input of each of the plurality of latches is wired to the scan output of another one of the plurality of latches;

creating a digital layout representative of the circuit design;

generating a first scan chain having a first wire length on the digital layout based on the first scan wiring arrangement;

creating a second scan chain from the first scan chain on the digital layout, the second scan chain having a second wire length less than the first wire length of the first scan chain; and generating a second digital label on the digital schematic based on the second scan chain, the second digital label provides a second scan wiring arrangement for the plurality of latches in the circuit design, the second scan wiring arrangement configured to identify a second order to which the scan input of each of the plurality of latches is wired to the scan output of another one of the plurality of latches.

2. The method as in claim 1, further comprising creating a primary input pin and a primary output pin in the circuit design, the primary input pin being electrically coupled to the scan input pin of one of the plurality of latches and the primary output pin being electrically coupled to the scan output pin of another of the plurality of latches.

3. The method as in claim 1, further comprising generating a first digital representation of the first digital label in a hardware description language.

4. The method as in claim 3, wherein the hardware description language is VHDL.

5. The method as in claim 1, further comprising generating a second digital representation of the second digital label in a hardware description language.

6. The method as in claim 5, wherein the hardware description language is VHDL.

7. An electronic computer-aided design system for optimizing a scan chain ordering in circuit designs, the system, the system comprising:

a computer readable medium having embodied therein a computer program configured to create a digital schematic representative of a circuit design having a first functional cell and a second functional cell, the first functional cell and the second functional cell each having a plurality of latches therein; create a scan input pin and a scan output pin for each of the plurality of latches in the first functional cell and the second functional cell on the digital schematic; generate a first digital label on the digital schematic configured to provide a first scan wiring arrangement for the plurality of latches in the circuit design, the first scan wiring arrangement configured to identify a first order to which the scan input of each of the plurality of latches is wired to the scan output of another one of the plurality of latches; create a digital layout representative of the circuit design; generate a first scan chain having a first wire length on the digital layout based on the first scan wiring arrangement; create a second scan chain from the first scan chain on the digital layout, the second scan chain having a second wire length less than the first wire length of the first scan chain; and generate a second digital label on the digital schematic based on the second scan chain, the second digital label provides a second scan wiring arrangement for the plurality of latches in the circuit design, the second scan wiring arrangement configured to identify a second order to which the scan input of each of the plurality of latches is wired to the scan output of another one of the plurality of latches.

8. The system as in claim 7, wherein the computer program is further configured to generate a digital representation of the second digital label in a hardware description language.

9. The system as in claim 8, wherein the hardware description language is VHDL.

\* \* \* \* \*